United States Patent
Tanabe

[19]

[11] Patent Number: 6,052,330
[45] Date of Patent: Apr. 18, 2000

[54] SEMICONDUCTOR MEMORY WITH ARBITRARY DATA MASKING

[75] Inventor: Tetsuya Tanabe, Tokyo, Japan

[73] Assignee: Oki Electric Industry Co., Ltd., Tokyo, Japan

[21] Appl. No.: 09/120,798

[22] Filed: Jul. 23, 1998

[30] Foreign Application Priority Data

Jul. 24, 1997 [JP] Japan ................................ 9-214059

[51] Int. Cl.[7] .................................................. G11C 8/00
[52] U.S. Cl. ........................................ 365/233; 365/221
[58] Field of Search ...................... 365/221, 233

[56] References Cited

U.S. PATENT DOCUMENTS

| | | | |
|---|---|---|---|
| 5,315,560 | 5/1994 | Nishimoto et al. | 365/189.05 |
| 5,587,954 | 12/1996 | Vogley et al. | 365/221 |
| 5,659,518 | 8/1997 | McLaury | 365/233 |
| 5,678,058 | 10/1997 | Sato | 395/800 |

FOREIGN PATENT DOCUMENTS

| | | |
|---|---|---|
| 07093225 | 4/1995 | Japan. |
| 08286977 | 11/1996 | Japan. |

OTHER PUBLICATIONS

Jei Hawn Yoo, "A 32–Bank 1Gb DRAM with 1Gb/s Band Width", IEEE International Solid–State Circuits Conference, 1996, pp. 378–379.

*Primary Examiner*—David Nelms
*Assistant Examiner*—VanThu Nguyen
*Attorney, Agent, or Firm*—Venable; Robert J. Frank; Jeffrey W. Gluck

[57] ABSTRACT

It is an object of the invention to provide a semiconductor memory capable of masking arbitrary number of data of a plurality of input-output data. To achieve this object, the semiconductor memory comprises a memory part for storing therein a plurality of data, a data control circuit to which input data mask control signals and an output data mask control signal are inputted for masking arbitrary data of a plurality of consecutive data which are written on the memory part in response to the input data mask control signals, and for masking arbitrary data of a plurality of consecutive data which are read from the memory part in response to the output data mask control signal, and a data mask control circuit for generating the input data mask control signals, and the output data mask control signal in response to the input-output data mask control signals.

25 Claims, 9 Drawing Sheets

SEMICONDUCTOR MEMORY WITH ARBITRARY DATA MASKING

BACKGROUND OF THE INVENTION

The invention relates to a semiconductor memory, particularly, to a semiconductor memory to which data is inputted or from which data is outputted at a frequency higher than a clock frequency.

There has been recently developed a semiconductor memory capable of inputting and outputting data in synchronization with dual edge (leading edge and trailing edge of a clock) in view of data transfer at high speed.

The semiconductor memory capable of inputting and outputting data at a frequency higher than a clock frequency is disclosed, for example, in Jei-Hawn Yoo, "A 32-Bank 1 Gb DRAM with 1 Gb/s Bandwidth," 1996 IEEE International Solid-State Circuits Conference, pp. 378–379.

A conventional semiconductor memory such as a synchronous dynamic RAM (SDRAM) can mask data which are consecutively inputted and outputted therethrough. For example, data which is not needed to be reloaded is masked when data is written. Data which is not needed to be outputted to an external device is masked when data is read, With this operation, the conventional semiconductor memory realizes efficient data processing.

In the conventional data masking, data has been masked by two units, four units, etc. but data has not been masked one by one when data is inputted or outputted at a frequency higher than a clock frequency. It has been desired recently to mask data one by one for efficiently processing data.

SUMMARY OF THE INVENTION

It is an object of the invention to provide a semiconductor memory capable of masking arbitrary numbers of data of a plurality of inputted and outputted data.

To achieve the above object, the semiconductor memory comprises a memory part for storing therein a plurality of data, a data control circuit to which input data mask control signals and an output data mask control signal are inputted for masking arbitrary data of a plurality of consecutive data which are written on the memory part in response to the input data mask control signals, and for masking arbitrary data of a plurality of consecutive data which are read from the memory part in response to the output data mask control signal, and a data mask control circuit for generating the input data mask control signals, and the output data mask control signal in response to the input-output data mask control signal.

DESCRIPTION OF THE PREFERRED EMBODIMENTS

Figure 1:
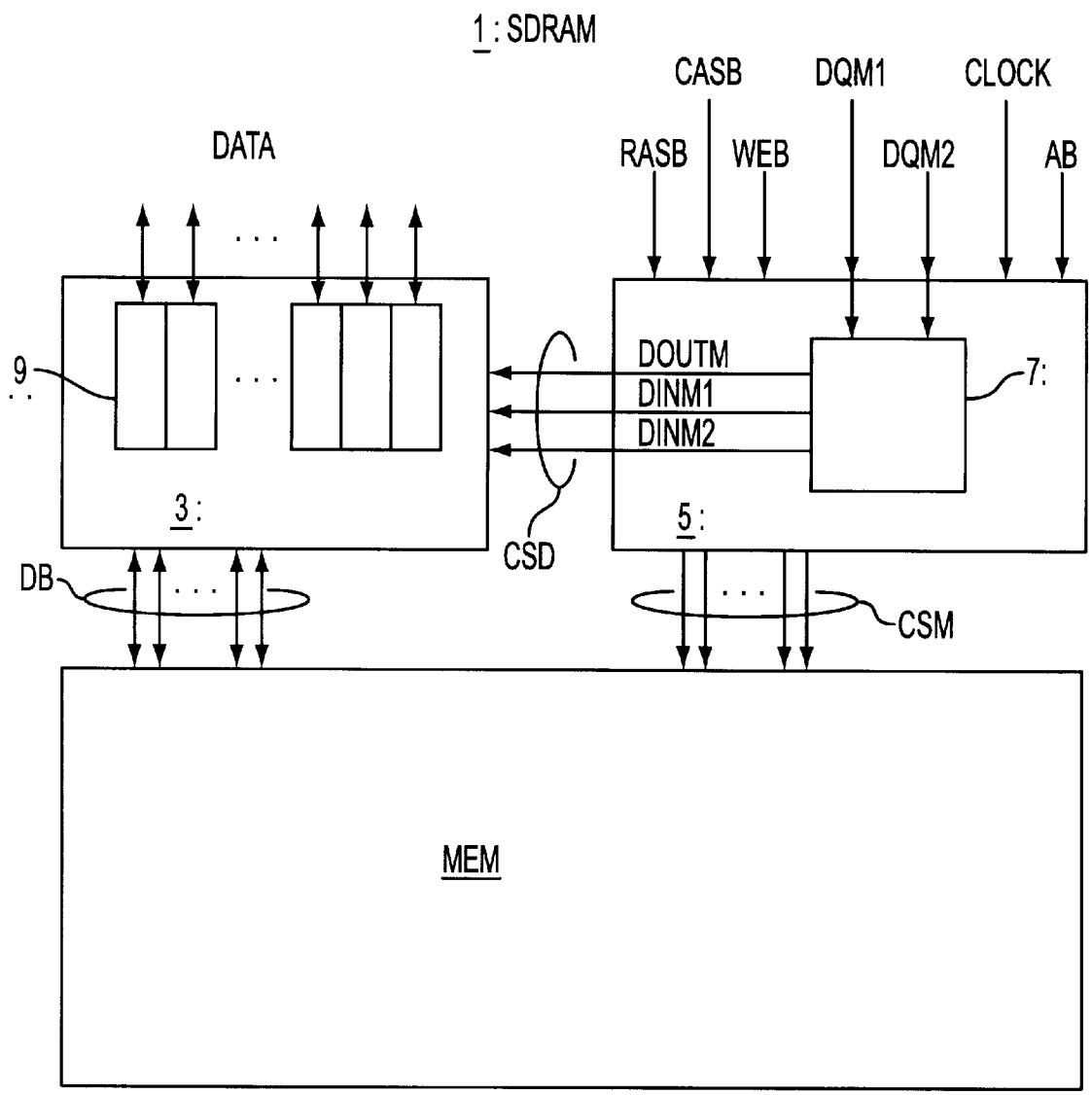
FIG. 1 is a block diagram showing the construction of a semiconductor memory according to a first embodiment of the invention.

First Embodiment (FIGS. 1 to 4):

FIG. 1 is a view showing the construction of a semiconductor memory according to a first embodiment of the invention.

FIG. 1 shows a SDRAM 1. The SDRAM 1 comprises a memory part MEM, a data control part 3 and a control part 5. The data control part 3 includes a plurality of data control circuits 9, and the control part 5 includes a data mask control circuit 7.

The memory part EM holds predetermined data, and the data control part 3 controls input-output of the data therethrough. The control part 5 controls the data control part 3 by a group of control signals CSD and also controls the memory part MEM based on a group of control signals CSM. The group of control signals CSD include an output data mask control signal DOUTM, a first input data mask control signal DINM1 and a second input data mask control signal DINM2.

The data control part 3 controls input-output of data between itself and an external device. The data control part 3 also controls internal data of the memory part MEM which are inputted or outputted through data buses DB.

A signal RASB for controlling access to a row address, a signal CASB for controlling access to a column address, a signal WEB for controlling input-output of data, a first input-output data mask control signal DQM1 for controlling masking of input-output data, a second input-output data mask control signal DQM2, an external clock CLOCK, and an address bus AB.

Figure 2:
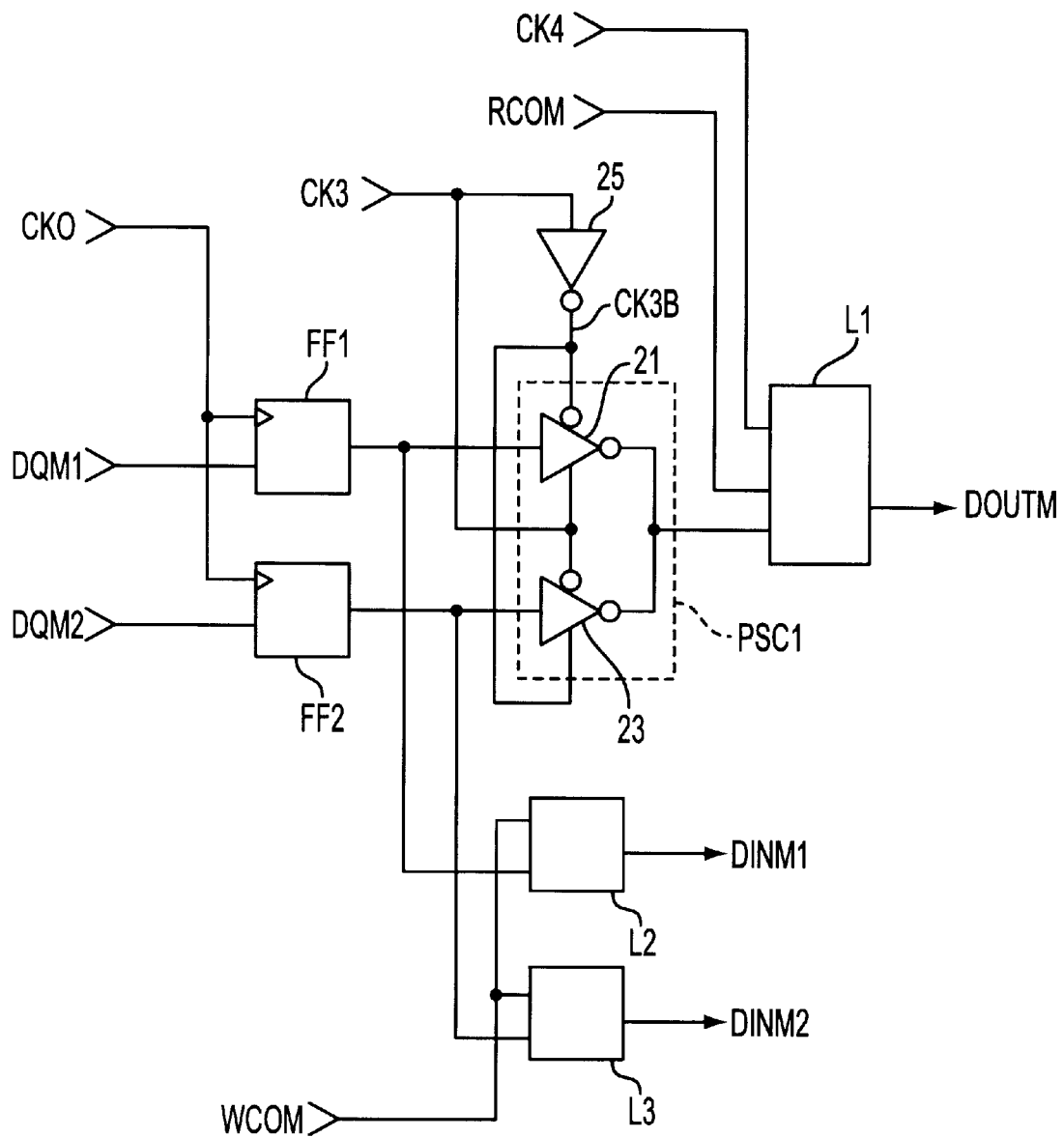
FIG. 2 is a circuit diagram showing a data mask control device in FIG. 1.

The construction of the data mask control circuit 7 included in the control part 5 will be now described with reference to FIG. 2.

The data mask control circuit 7 comprises two flip-flops FF1 and FF2, a parallel-serial converter part PSC1 composed of two clocked inverters 21 and 23, three latch circuits L1, L2 and L3 and an inverter 25.

The first input-output data mask control signal DQM1 is inputted to the flip-flop FF1 of the data mask control circuit 7 and the second input-output data mask control signal DQM2 is inputted to the flip-flop FF2 of the data mask control circuit 7. An internal clock CK0 is an internal clock which is synchronized with the external clock CLOCK, and it is inputted to clock input terminals of the flip-flops FF1 and FF2.

An output signal of the flip-flop FF1 is inputted to the clocked inverter 21 and the latch circuit L2. An output signal of the flip-flop FF2 is inputted to the clocked inverter 23 and the latch circuit L3.

An output signal of the clocked inverter 21 and that of the clocked inverter 23 are collected to form an output signal of the parallel-serial converter part PSC1. The output signal of the parallel-serial converter part PSC1 is inputted to the latch circuit L1. An internal clock CK3 which is synchronized with the external clock CLOCK is inputted to an n control terminal of the clocked inverter 21 and a p control terminal of the clocked inverter 23. An internal clock CK3B which is generated by logically inverting the internal clock CK3 by the inverter 25 is inputted to the p control terminal of the clocked inverter 21 and the n control terminal of the clocked inverter 23.

The output signal of the parallel-serial converter part PSC1, an internal clock CK4 which is synchronized with the external clock CLOCK and a read command RCOM are inputted to the latch circuit L1. The latch circuit L1 outputs the output data mask control signal DOUTM.

The output signal of the flip-flop FF1 and a write command WCOM are inputted to the latch circuit L2. The latch circuit L2 outputs the first input data mask control signal DINM1.

The output signal of the flip-flop FF2 and the write command WCOM are inputted to the latch circuit L3. The latch circuit L3 outputs the second input data mask control signal DINM2.

Figure 3:
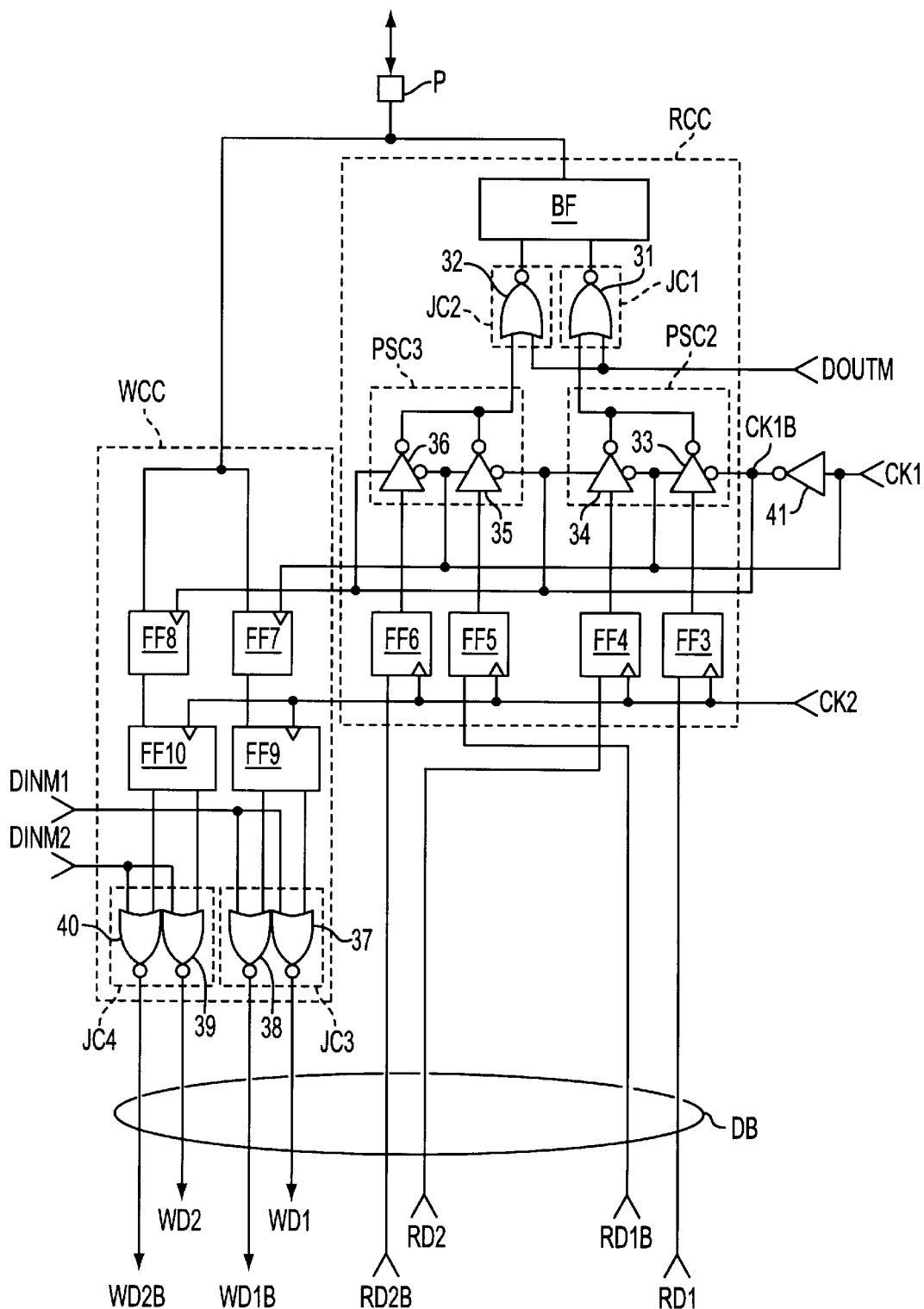
FIG. 3 is a circuit diagram showing a data control device in FIG. 1.

Each construction of the data control circuit 9 included in the data control part 3 will be now described with reference to FIG. 3.

The data control circuits 9 mainly comprises a read control circuit RCC and a write control circuit WCC. An output of the read control circuit RCC and an input of the write control circuit WCC are connected to an input-output pad P. Data is inputted and outputted between the data control circuit and an external device through the input-output pad P.

The read control circuit RCC comprises four flip-flops FF3, FF4, FF5 and FF6, two parallel-serial converter parts PSC2 and PSC3, two decision circuits JC1 and JC2, and a buffer circuit BF.

The parallel-serial converter part PSC2 comprises two clocked inverters 33 and 34, and the parallel-serial converter part PSC3 comprises two clocked inverters 35 and 36. The decision circuit JC1 comprises a NOR gate 31 and the decision circuit JC2 comprises a NOR gate 32.

Read data RD1, RD2, RD1B and RD2B from the memory part MEM are respectively inputted to the flip-flops FF3, FF4, FF5 and FF6 of the read control circuit RCC through the data buses DB.

The read data RD1B and RD2B are generated by logically inverting the data RD1 and RD2. Further, an internal clock CK2 which is synchronized with the external clock CLOCK is inputted to clock input terminals of the four flip-flops FF3, FF4, FF5 and FF6.

Output signals of the four flip-flops FF3, FF4, FF5 and FF6 are respectively inputted to the clocked inverters 33, 34, 35 and 36. The internal clock CK1 which is synchronized with the external clock CLOCK is inputted to an n control terminal of the clocked inverter 33, the p control terminal of the clocked inverter 34, an n control terminal of the clocked inverter 35 and a p control terminal of the clocked inverter 36. An internal clock CK1B which is generated by logically inverting the internal clock CK1 by an inverter 41 is inputted to a p control terminal of the clocked inverter 33, an n control terminal of the clocked inverter 34, a p control terminal of the clocked inverter 35 and an n control terminal of the clocked inverter 36.

An output signal of the clocked inverter 33 and that of the clocked inverter 34 are collected to form an output signal of the parallel-serial converter part PSC2. An output signal of the parallel-serial converter part PSC2 is inputted to one input terminal of the NOR gate 31 constituting the decision circuit JC1.

An output signal of the clocked inverter 35 and that of the clocked inverter 36 are collected to form an output signal of the parallel-serial converter part PSC3. An output signal of the parallel-serial converter part PSC3 is inputted to one input terminal of the NOR gate 32 constituting the decision circuit JC2.

The output data mask control signal DOUTM from the data mask control circuit 7 is inputted to other input terminals of the NOR gates 31 and 32.

The output signals of the NOR gates 31 and 32, namely, the output signals of the decision circuits JC1 and JC2 are outputted to the input-output pad P through the buffer circuit BF.

The write control circuit WCC comprises four flip-flops FF7, FF8, FF9 and FF10, and two decision circuits JC3 and JC4. The decision circuit JC3 comprises two NOR gates 37 and 38 and the decision circuit JC4 comprises two NOR gates 39 and 40.

Write data from an external device is inputted to the write control circuit WCC through the input-output pad P. The thus inputted write data is first inputted to the flip-flops FF7 and FF8.

The internal clock CK1 is inputted to a clock input terminal of the flip-flop FF7 and the internal clock CK1B is inputted to a clock input terminal of the flip-flop FF8.

An output of the flip-flop FF7 is connected to an input terminal of the flip-flop FF9 and an output of the flip-flop FF8 is connected to an input terminal of the flip-flop FF10. The internal clock CK2 is inputted to clock input terminals of the flip-flops FF9 and FF10.

An output of the flip-flop FF9 and its inverted output are respectively inputted to one input terminals of the NOR gates 37 and 38. An output of the flip-flop FF10 and its inverted output are respectively inputted to one input terminals of the NOR gates 39 and 40.

The first input data mask control signal DINM1 from the data mask control circuit 7 is inputted to other input terminals of the NOR gates 37 and 38. The second input data mask control signal DINM2 from the data mask control circuit 7 is inputted to other input terminals of the NOR gates 39 and 40.

Write data WD1, WD1B, WD2 and WD2B are respectively outputted from the NOR gates 37, 38, 39 and 40. The thus outputted write data WD1, WD1B, WD2 and WD2B are written on the memory part MEM through the data buses DB.

The write data WD1B and WD2B are respectively logically inverted data of the data WD1 and WD2.

Figure 4:
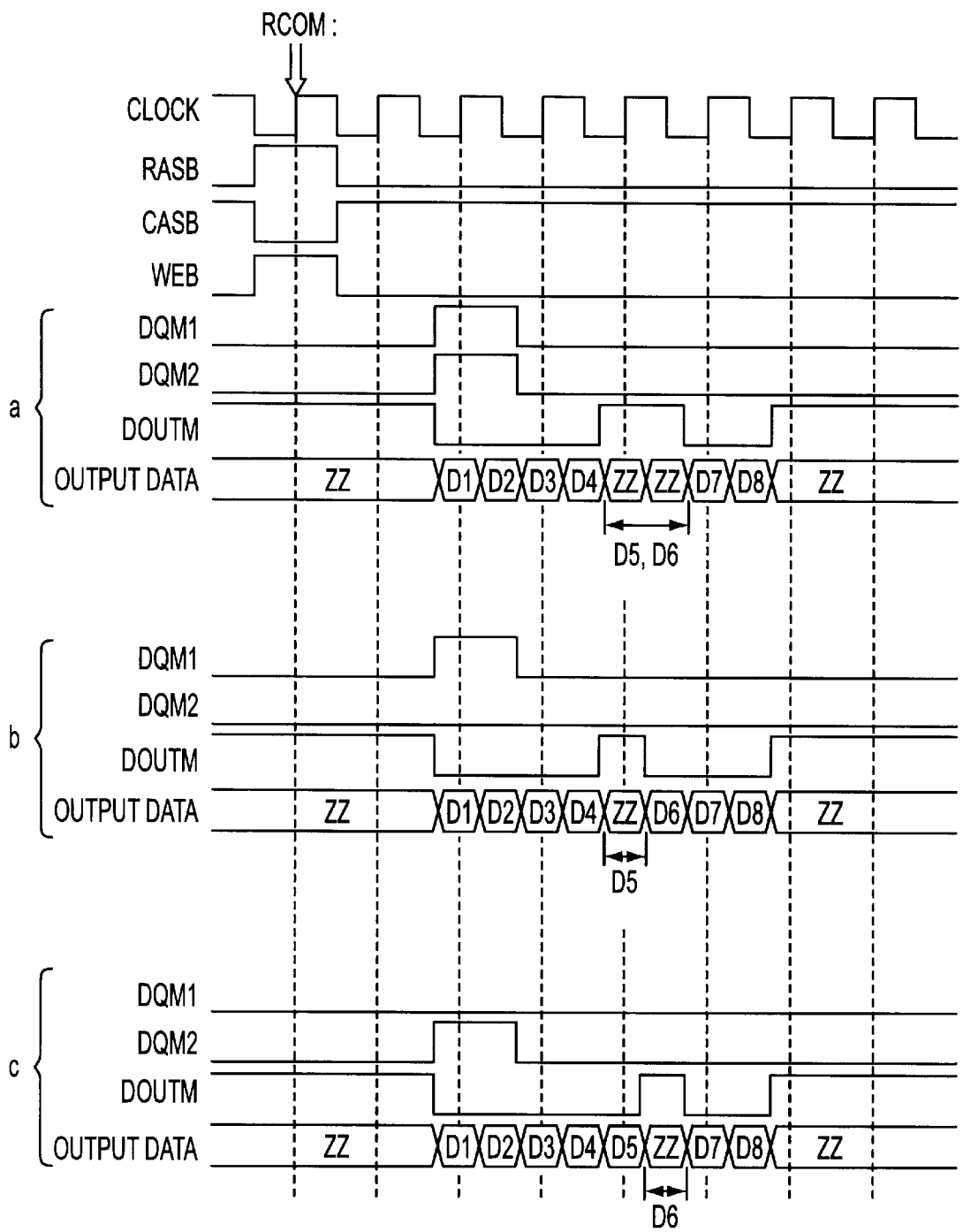
FIG. 4 shows waveforms of signals when data is read according to the first embodiment of the invention.
Figure 5:
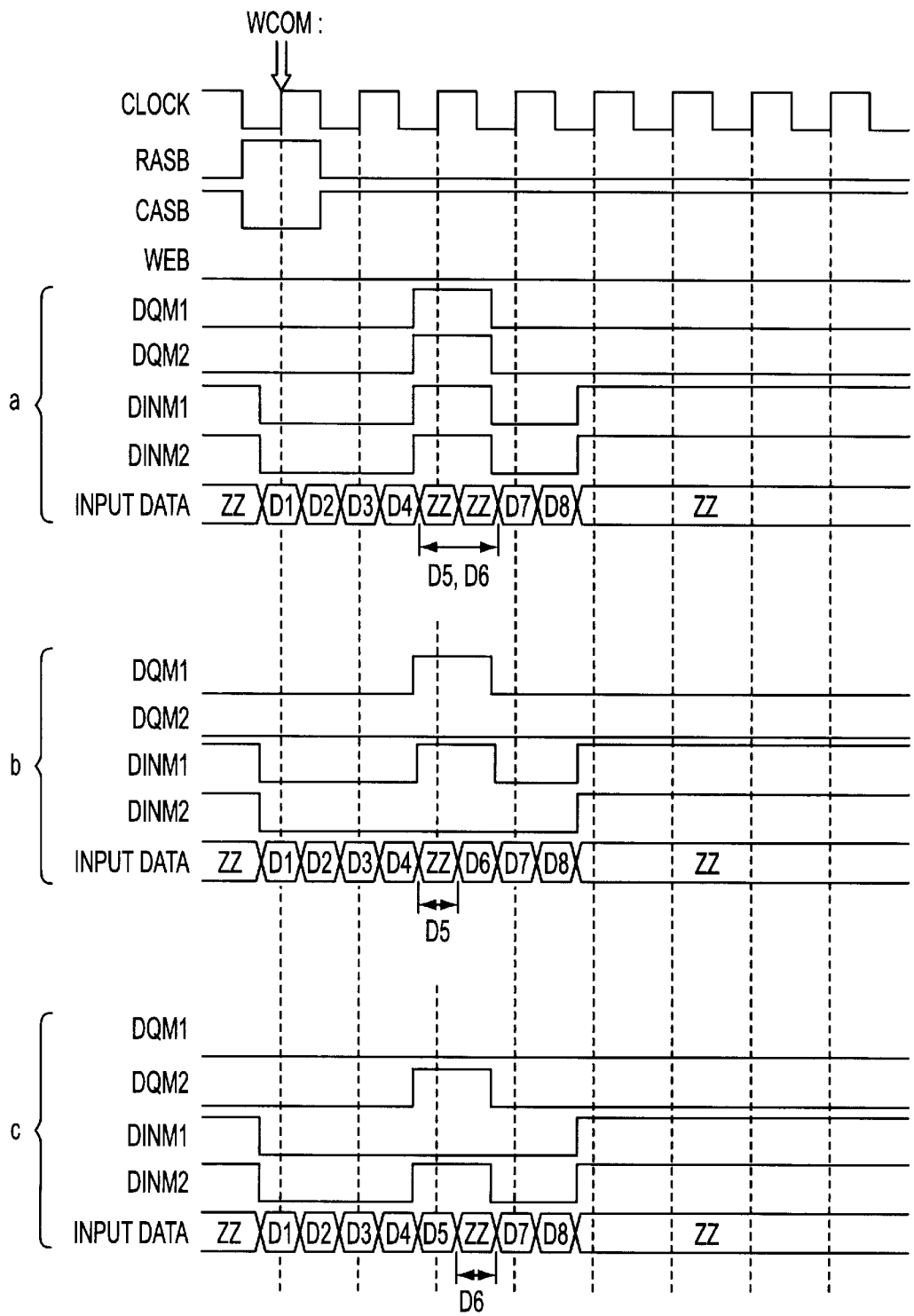
FIG. 5 shows waveforms of signals when data is written according to the first embodiment of the invention.

Data read and write operations of the SDRAM 1 having the construction set forth above will be now described with reference to FIGS. 4 and 5.

The data read operation based on the read command RCOM will be first described. The high level control signal RASB, the low level control signal CASB and the high level control signal WEB are respectively inputted to the control part 5. Suppose that the control signal CASB has latency of "2" and burst length of "8".

In cases where one cycle of high level signal is inputted to both the first input-output data mask control signal DQM1 and the second input-output data mask control signal DQM2 (see FIG. 4, waveform a):

The flip-flops FF1 and FF2 of the data mask control circuit 7 receive the high level signals of the first input-output data mask control signal DQM1 and the second input-output data mask control signal DQM2. Thereafter, the flip-flops FF1 and FF2 output high level signals in synchronization with the internal clock CK0.

The parallel-serial converter part PSC1 logically inverts the output signal of the flip-flop FF1 and outputs a low level signal when the internal clock CK3 is at high level, while it logically inverts the output signal of the flip-flop FF2 and outputs a low level signal when the internal clock CK3 is at low level.

The latch circuit L1 outputs a signal which is generated by logically inverting the output signal of the parallel-serial converter part PSC1 as the output data mask control signal DOUTM. The output data mask control signal DOUTM is behind the output signal of the parallel-serial converter part PSC1 by two clocks of the internal clock CK4.

Read data RD1, RD2, RD3 and RD4 are inputted to the flip-flops FF3, FF4, FF5 and FF6 of the read control circuit RCC of the data control circuit 9 through the data buses DB. The flip-flops FF3, FF4, FF5 and FF6 output the read data RD1, RD2, RD3 and RD4 at the leading edge of the internal clock CK2.

The parallel-serial converter part PSC2 outputs a signal which is generated by logically inverting the output signal of the flip-flop FF3 when the internal clock CK1 is at high level while it outputs a signal which is generated by logically inverting the output signal of the flip-flop FF4 when the internal clock CK1 is at low level.

The parallel-serial converter part PSC2 converts the frequencies of the flip-flops FF3 and FF4 into those doubled.

The parallel-serial converter part PSC3 outputs a signal which is generated by logically inverting the output signal of the flip-flop FF5 when the internal clock CK1 is at high level while it outputs a signal which is generated by logically inverting the output signal of the flip-flop FF6 when the internal clock CK1 is at low level.

The parallel-serial converter part PSC3 converts the frequencies of the flip-flops FF5 and FF6 into those doubled.

The decision circuits JC1 and JC2 output a low level signal when the output data mask control signal DOUTM is at high level. The decision circuits JC1 and JC2 output signals which are generated by inverting output signals of the parallel-serial converter parts PSC2 and PSC3 when the output data mask control signal DOUTM is at low level, and they output a signal which is generated by logically inverting the output signal of the flip-flop FF4 when the internal clock CK1 is at low level.

The buffer circuit BF outputs a high level signal when the output signal of the decision circuit JC1 is at high level, and outputs a low level signal when the output signal of the decision circuit JC2 is at high level. The buffer circuit BF generates high impedance output ZZ when both output signals of the decision circuits JC1 and JC2 are at low level. The buffer circuit BF generates the high impedance output ZZ during periods other than read times of the data D1 to D8 and at data masking times.

With the operations set forth above, two data are masked, which data are behind by two cycles of the external clock CLOCK after a high level signal having time duration equivalent to one cycle of clock is inputted to the first input-output data mask control signal DQM1 and the second input-output data mask control signal DQM2. These data are illustrated by data D5 and data D6 in FIG. 4.

In cases where the first input-output data mask control signal DQM1 receives one cycle of a high level signal and the second input-output data mask control signal DQM2 receives a low level signal (see FIG. 4, waveform b):

The flip-flop FF1 of the data mask control circuit 7 outputs a high level signal which is synchronized with the internal clock CK0. The flip-flop FF2 of the data mask control circuit 7 outputs a low level signal.

The parallel-serial converter part PSC1 outputs a low level signal by logically inverting the output signal of the flip-flop FF1 when the internal clock CK3 is at high level, while it outputs a high level signal by logically inverting the output signal of the flip-flop FF2 when the internal clock CK3 is at low level.

The latch circuit L1 outputs a signal which is generated by logically inverting the output signal of the parallel-serial converter part PSC1 as the output data mask control signal DOUTM. The output data mask control signal DOUTM is behind the output signal of the parallel-serial converter part PSC1 by two clocks of the internal clock CK4.

Since the second input-output data mask control signal DQM2 is at low level, the output signal of the parallel-serial converter part PSC1 becomes at low level during the period when the output signal of the flip-flop FF1 is logically inverted. This is the period when the internal clock CK3 is at high level. Accordingly, the output data mask control signal DOUTM becomes at high level during a half of the clock cycle.

When a high level signal having a time interval corresponding to one cycle of the clock is inputted to the first input-output data mask control signal DQM1 and a low level signal is inputted to the second input-output data mask control signal DQM2, the first of two data which are delayed by two cycles of the external clock CLOCK is masked after the high level signal is inputted to the first input-output data mask control signal DQM1. This is represented by data D5 in FIG. 4.

In cases where the first input-output data mask control signal DQM1 receives a low level signal and the second input-output data mask control signal DQM2 receives one cycle of a high level signal (see FIG. 4, waveform c):

The flip-flop FF1 of the data mask control circuit 7 outputs a low level signal. The flip-flop FF2 of the data mask control circuit 7 outputs a high level signal which is synchronized with the internal clock CK0.

The parallel-serial converter part PSC1 outputs a high level signal by logically inverting the output signal of the flip-flop FF1 when the internal clock CK3 is at high level, while it outputs a high level signal by logically inverting the output signal of the flip-flop FF2 when the internal clock CK3 is at low level.

The latch circuit L1 outputs a signal which is generated by logically inverting the output signal of the parallel-serial converter part PSC1 as the output data mask control signal DOUTM. The output data mask control signal DOUTM is behind the output signal of the parallel-serial converter part PSC1 by two clocks of the internal clock CK4.

Since the first input-output data mask control signal DQM1 is at low level, the output of the parallel-serial converter part PSC1 goes to at low level during the period when the output signal of the flip-flop FF2 is logically inverted. This corresponds to the period when the internal clock CK3 is at low level. Accordingly, the output data mask control signal DOUTM goes to high level during a half of the clock cycle.

When a low level signal is inputted to the first input-output data mask control signal DQM1 and a high level signal having time interval corresponding to one cycle of clock is inputted to the second input-output data mask control signal DQM2, the second of two data which are behind by two cycles of the external clock CLOCK is masked after the high level signal is inputted to the second input-output data mask control signal DQM2. This is represented by data D6.

In cases where the first input-output data mask control signal DQM1 and the second input-output data mask control signal DQM2 receive a low level signal:

The output data mask control signal DOUTM from the data mask control circuit 7 is always at low level. Accordingly, the output data is not masked.

According to the invention set forth above, arbitrary data of data which are consecutively read at a frequency higher than a clock frequency can be masked.

The data write operation based on the write command WCOM will be next described.

The high level control signal RASB and the low level control signal CASB and the low level control signal WEB are respectively inputted to the control part 5.

In cases where the first input-output data mask control signal DQM1 and the second input-output data mask control signal DQM2 receive one cycle of high level signal (see FIG. 5, waveform a):

The flip-flops FF1 and FF2 of the data mask control circuit 7 output high level signals which are synchronized with the internal clock CK0.

The latch circuit L2 outputs a high level output signal of the flip-flop FF1 as the first input data mask control signal DINM1 based on the write command WCOM. The latch circuit L3 outputs a high level output signal of the flip-flop FF2 as the second input data mask control signal DINM2 based on the write command WCOM.

Data from the input-output pad P is inputted to the flip-flop FF7 of the data control circuits 9. The flip-flop FF7 outputs given data to the flip-flop FF9 in synchronization with the leading edge of the internal clock CK1. Data from the input-output pad P is inputted to the flip-flop FF8. The flip-flop FF8 outputs given data to the flip-flop FF10 in synchronization with the leading edge of the internal clock CK1.

The signals which are converted into serial-parallel signals in the flip-flops FF7 and FF8 are outputted to the flip-flops FF9 and FF10 in synchronization with the internal clock CK2 at its leading edge.

The decision circuit JC3 outputs the low level write data WD1 and WD1B when the first input data mask control signal DINM1 is at high level, and outputs the write data WD1 and WD1B which are generated by logically inverting complementary output of the flip-flop FF9 when the first input data mask control signal DINM1 is at low level.

The decision circuit JC4 outputs the low level write data WD2 and WD2B when the second input data mask control signal DINM2 is at high level, and outputs the write data WD2 and WD2B which are generated by logically inverting complementary output of the flip-flop FF10 when the second input data mask control signal DINM2 is at low level.

When a high level signal is inputted to the first input-output data mask control signal DQM1 and the second input-output data mask control signal DQM2, both the first input data mask control signals DINM1 and DINM2 become high level outputs. Accordingly, the decision circuits JC3 and JC4 are rendered in a state to mask data. Accordingly, two consecutive data are masked from the time when the first and second input-output data mask control signals DQM1 and DQM2 are fetched with the internal clock CK0. This is represented by data D5 and D6 in FIG. 5.

In cases where the first input-output data mask control signal DQM1 receives one cycle of high level signal and the second input-output data mask control signal DQM2 receives a low level signal (see FIG. 5, waveform b):

The flip-flop FF1 of the data mask control circuit 7 outputs a high level signal which is synchronized with the internal clock CK0. The flip-flop FF2 of the data mask control circuit 7 outputs a low level signal.

The latch circuit L2 outputs the high level output signal of the flip-flop FF1 as the first input data mask control signal DINM1 based on the write command WCOM. The latch circuit L3 outputs the low level output signal of the flip-flop FF2 as the second input data mask control signal DINM2 based on the write command WCOM.

The decision circuit JC3 of the data control circuit 9 masks data upon reception of the high level first input data mask control signal DINM1.

The decision circuit JC4 outputs the write data WD2 and the WD2B which are generated by logically inverting the complementary output of the flip-flop 10 upon reception of the low level second input data mask control signal DINM2.

Accordingly, first data of the consecutive two data is masked from the time when the high level signal of the first input-output data mask control signal DQM1 is fetched with the internal clock CK0. This is represented by data D5 in FIG. 5.

In cases where the first input-output data mask control signal DQM1 receives a low level signal and the second input-output data mask control signal DQM2 receives one cycle of high level signal (FIG. 5, a waveform c):

The flip-flop FF1 of the data mask control circuit 7 outputs a low level signal which is synchronized with the internal clock CK0. The flip-flop FF2 of the data mask control circuit 7 outputs a high level signal.

The latch circuit L2 outputs the low level output signal of the flip-flop FF1 as the first input data mask control signal DINM1 based on the write command WCOM. The latch circuit L3 outputs the high level output signal of the flip-flop FF2 as the second input data mask control signal DINM2 based on the write command WCOM.

The decision circuit JC3 of the data control circuit 9 outputs the write data WD1 and the WD1B which are generated by logically inverting the complementary output from the data control circuit 9 upon reception of the low level first input data mask control signal DINM1.

The decision circuit JC4 masks data upon reception of the high level second input data mask control signal DINM2.

Accordingly, second data of the consecutive two data is masked from the time when the high level signal of the second input-output data mask control signal DQM2 is fetched with the internal clock CK0. This is represented by data D6 in FIG. 5.

In cases where both the first input-output data mask control signal DQM1 and second input-output data mask control signal DQM2 receive a low level signal:

The first input data mask control signal DINM1 and second input data mask control signal DINM2 from the data mask control circuit 7 are always at low level. Accordingly, the input data is not masked.

The invention is applicable even if the input-output frequency is four times or more as large as the frequency of the external clock. Arbitrary data of a plurality of consecutive data can be masked by increasing the number of input-output data mask control signals.

Figure 6:
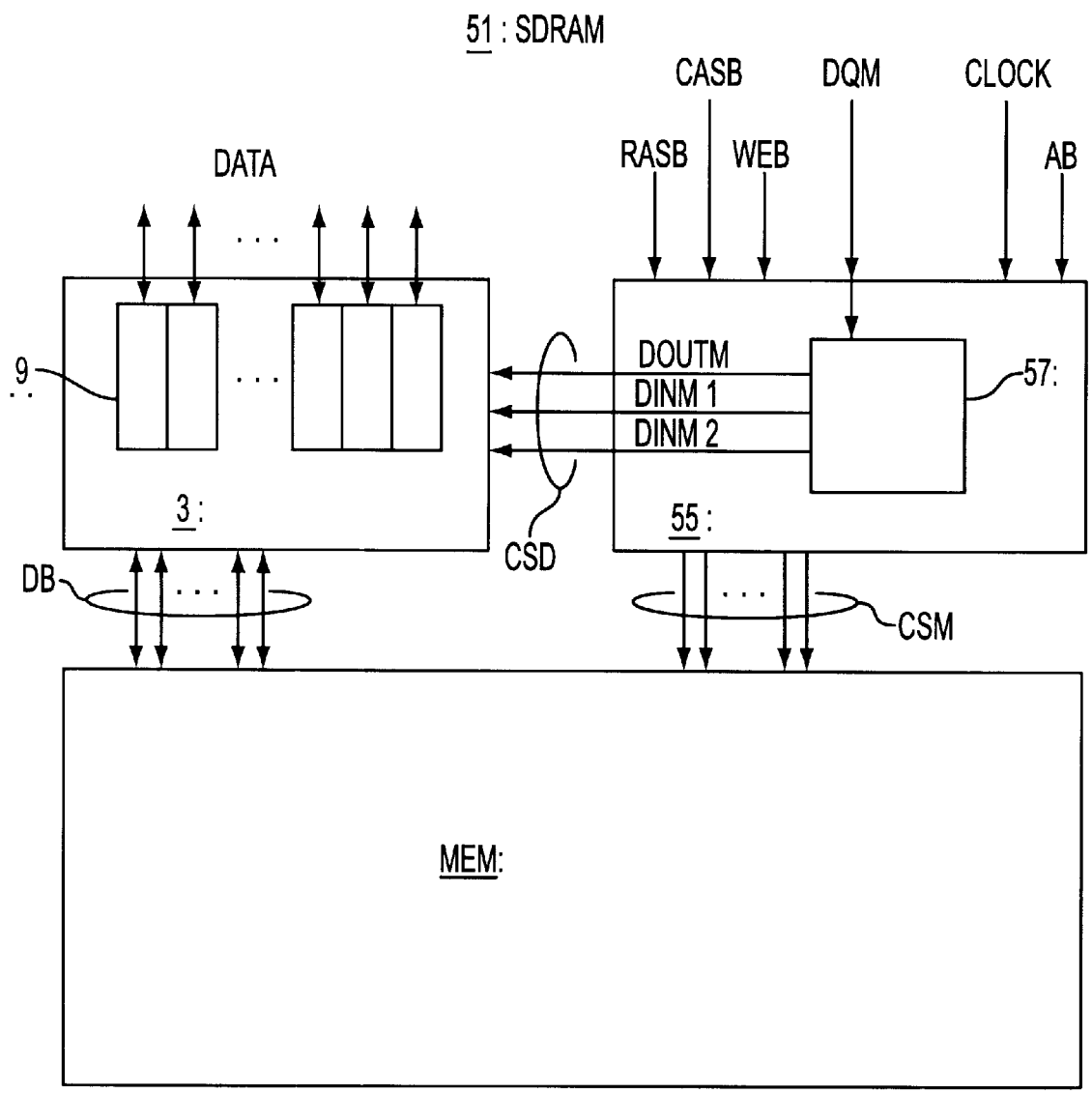
FIG. 6 is a block diagram showing the construction of a semiconductor memory according to a second embodiment of the invention.

Second Embodiment (FIG. 6):

FIG. 6 is a view showing the construction of a semiconductor memory according to a second embodiment of the invention.

FIG. 6 shows an SDRAM 51. The SDRAM 51 comprises a memory part MEM, a data control part 3 and a control part 55. The data control part 55 includes a data mask control circuit 57.

The control part 55 controls the data control part 3 by a group of control signals CSD and also controls the memory part MEM by a group of control signals CSM. The group of control signals CSD include an output data mask control signal DOUTM, a first input data mask control signal DINM1 and a second input data mask control signal DINM2.

A signal RASB for controlling access of a row address, a signal CASB for controlling access of a column address, a signal WEB for controlling input-output of data, an input-output data mask control signal DQM for controlling masking of the input-output data, an external clock CLOCK and address buses AB are inputted to the control part 55.

The input-output data mask control signal DQM is given in synchronization with a frequency with which data write and read operation is performed. The memory part MEM and the data control part 3 are the same as those of the first embodiment.

Figure 7:
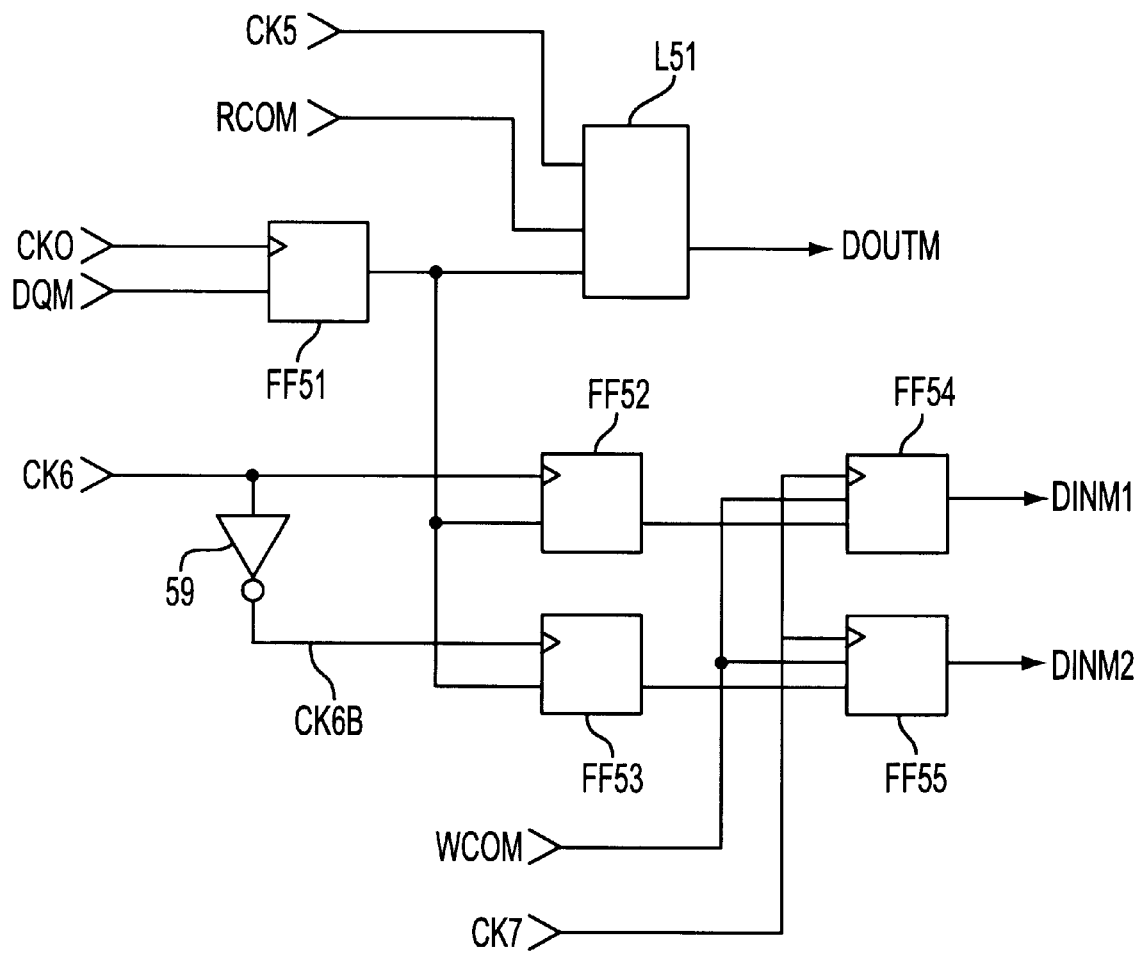
FIG. 7 is a circuit diagram showing a data mask control device in FIG. 6.

The construction of the data mask control circuit 57 included in the control part 55 will be now described now with reference to FIG. 7.

The data mask control circuit 57 comprises five flip-flops FF51, FF52, FF53, FF54 and FF55, a latch circuit L51 and an inverter 59.

The input-output data mask control signal DQM is inputted to the flip-flop FF51 of the data mask control circuit 57. An internal clock CK0 is an internal clock which is synchronized with the external clock CLOCK, and it is inputted to clock input terminals of the flip-flop FF51.

An output signal of the flip-flop FF51 is inputted to the flip-flops FF52 and FF53 and the latch circuit L51.

The output signal of the flip-flop FF51, the read command RCOM and an internal clock CK5 are inputted to the latch circuit LS1. The latch circuit L51 outputs the output data mask control signal DOUTM.

The output signal of the flip-flop FF51 and an internal clock CK6 which is synchronized with the external clock CLOCK are inputted to the flip-flop FF52.

The output signal of the flip-flop FF51 and a signal CK6B which is generated by logically inverting the internal clock CK6 are inputted to the flip-flop FF53.

The output signal of the flip-flop FF52, an internal clock CK7 which is synchronized with the external clock CLOCK and a write command WCOM are inputted to the flip-flop FF54. The flip-flop FF54 outputs the first input data mask control signal DINM1.

The output signal of the flip-flop FF53, the internal clock CK7 which is synchronized with the external clock CLOCK and the write command WCOM are inputted to the flip-flop FF55. The flip-flop FF55 outputs the second input data mask control signal DINM2.

Figure 8:
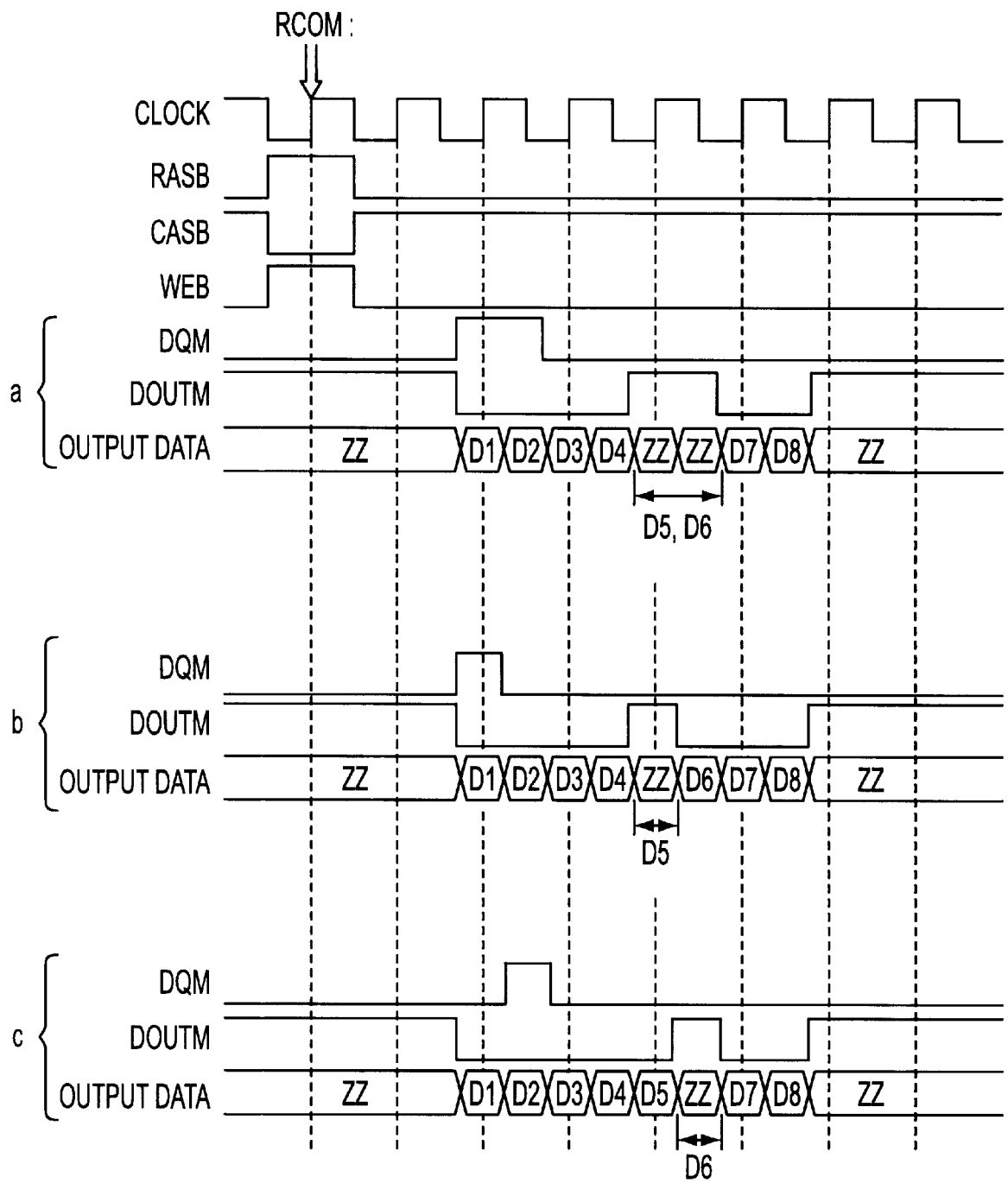
FIG. 8 shows waveforms of signals when data is read according to the second embodiment of the invention.
Figure 9:
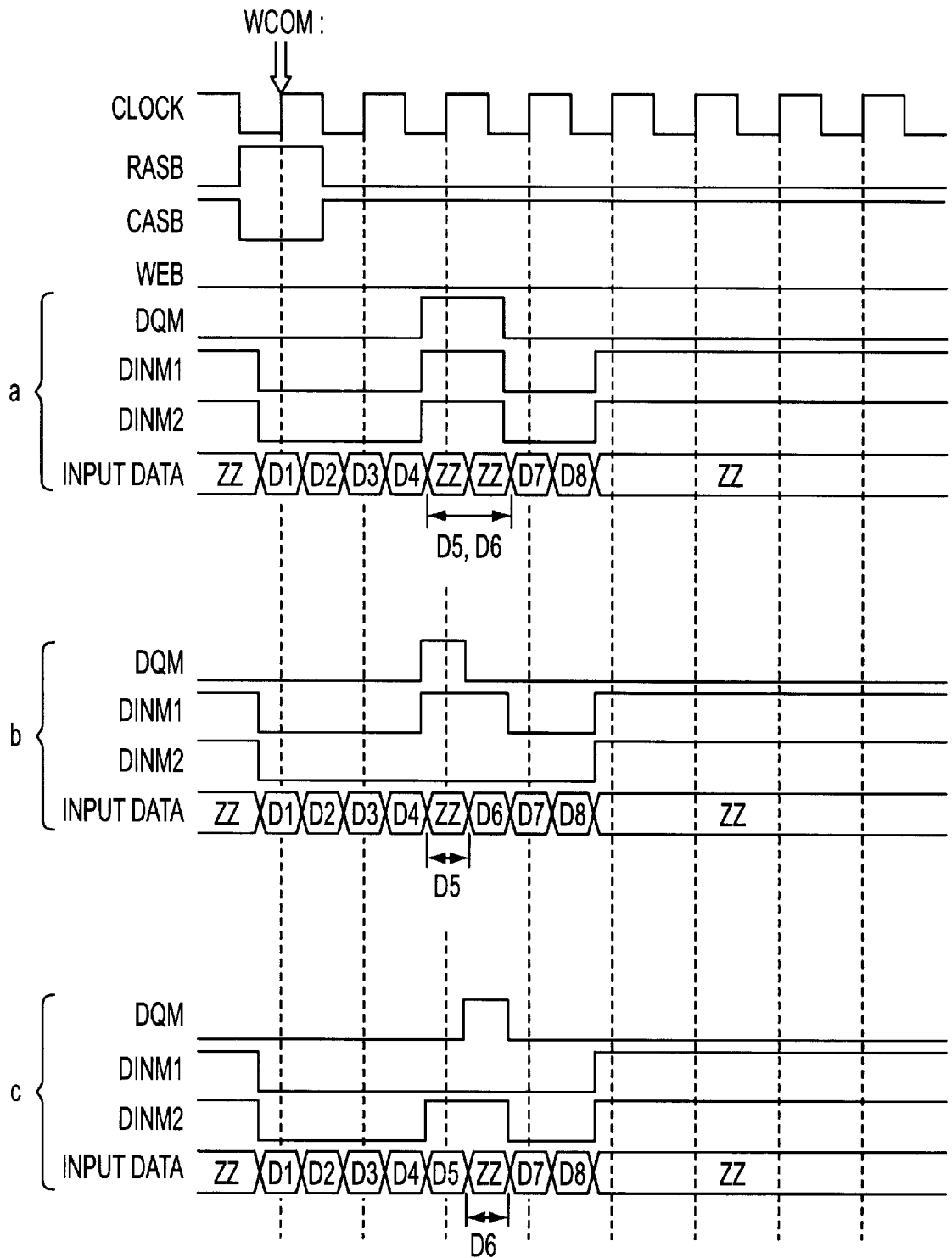
FIG. 9 shows waveforms of signals when data is written according to the second embodiment of the invention.

The data read and write operations of the SDRAM 51 having the construction as set forth above will be now described with reference to FIGS. 8 and 9.

The data read operation based on the read command RCOM will be first described. The high level control signal RASB and the low level control signal CASB and the high level control signal WEB are respectively inputted to the control part 55. Further, the control signal CASB has latency of "2" and burst length of "8".

In cases where the input-output data mask control signal DQM is at high level at leading edge and trailing edge of the external clock CLOCK (see FIG. 8, waveform a):

The flip-flop FF51 of the data mask control circuit 57 outputs the high level signals in synchronization with the leading edge and the trailing edge of the internal clock CK0.

The latch circuit L51 outputs the output signal of the flip-flop FF51 as the output data mask control signal DOUTM. The output data mask control signal DOUTM is behind the output signal of the flip-flop FF51 by two clocks of the internal clock CK5.

The output data mask control signal DOUTM is inputted to the decision circuits JC1 and JC2 of the data control circuit 9.

The operation, which is the same as in the first embodiment, is performed in the data control circuit 9, whereby two data are masked, which data are behind by two cycles of the external clock CLOCK. This is illustrated as data D5 and data D6 in FIG. 8.

In cases where the input-output data mask control signal DQM is at high level at the leading edge of the external clock CLOCK and it is at low level at the trailing edge thereof (see FIG. 8, waveform b):

The flip-flop FF51 of the data mask control circuit 57 outputs a high level signal in synchronization with the leading edge of the internal clock CK0 and outputs a low level signal in synchronization with the trailing edge thereof.

The latch circuit L51 outputs the output signal of the flip-flop FF51 as the output data mask control signal DOUTM. The output data mask control signal DOUTM is delayed by two clock of the internal clock CK5 compared with the output signal of the flip-flop FF51.

The output data mask control signal DOUTM is inputted to the decision circuits JC1 and JC2 of the data control circuit 9.

The operation, which is the same as in the first embodiment, is performed in the data control circuit 9, whereby the first of two data are masked, which data are behind by two cycles of the external clock CLOCK. This is illustrated as data D5 in FIG. 8.

In cases where the input-output data mask control signal DQM is at low level at the leading edge of the external clock CLOCK and it at high level at the trailing edge thereof (see FIG. 8, waveform b):

The flip-flop FF51 of the data mask control circuit 57 outputs a low level signal in synchronization with the leading edge of the internal clock CK0 and outputs a high level signal in synchronization with the trailing edge thereof.

The latch circuit L51 outputs the output signal of the flip-flop FF51 as the output data mask control signal DOUTM. The output data mask control signal DOUTM is behind the output signal of the flip-flop FF51 by two clocks of the internal clock CK5.

The output data mask control signal DOUTM is inputted to the decision circuits JC1 and JC2 of the data control circuit 9.

The operation, which is the same as in the first embodiment, is performed in the data control circuit 9, whereby the second of two data are masked, which data are behind by two cycles of the external clock CLOCK. This is illustrated as data D6 in FIG. 8.

In cases where the input-output data mask control signal DQM is at low level at the leading edge and trailing edge of the external clock CLOCK:

The output data mask control signal DOUTM from the data mask control circuit 57 is always at low level. Accordingly, the output data is not masked.

The data read operation based on the read command RCOM will now be described.

The high level control signal RASB, the low level control signal CASB and the low level control signal WEB are respectively inputted to the control part 55.

In cases where the input-output data mask control signal DQM is at high level at the leading edge and trailing edge of the eternal clock CLOCK (see FIG. 9, waveform a):

The flip-flop FF51 of the data mask control circuit 57 outputs a high level signal in synchronization with the leading edge and trailing edge of the internal clock CK0.

The flip-flop FF52 receives the output signal of the flip-flop FF51 and outputs a high level signal in synchronization with the internal clock CK6. The flip-flop FF53 receives the output signal of the flip-flop FF51 and outputs a high level signal in synchronization with the internal clock CK6B The flip-flop FF54 receives the output signal of the flip-flop FF52 and outputs the high level first input data mask control signal DINM1 in synchronization with the internal clock CK7. The flip-flop FF54 operates based on the write command WCOM.

The flip-flop FF55 receives the output signal of the flip-flop FF53 and outputs the high level second input data mask control signal DINM2 in synchronization with the internal clock CK7. The flip-flop FF55 operates based on the write command WCOM.

The operation, which is the same as in the first embodiment, is performed in the data control circuit 9, whereby two consecutive data are masked from the time when the input-output data mask control signal DQM is fetched with the internal clock CK0. This is illustrated as data D5 and data D6 in FIG. 9.

In cases where the input-output data mask control signal DQM is at high level at the leading edge of the external clock CLOCK and at low level at the trailing edge thereof (see FIG. 9, waveform b):

The flip-flop FF51 of the data mask control circuit 57 outputs a high level signal in synchronization with the leading edge of the internal clock CK0 and output a low level signal in synchronization with the trailing edge thereof.

The flip-flop FF52 receives the output signal of the flip-flop FF51 and outputs a high level signal in synchronization with the internal clock CK6. The flip-flop FF53 receives the output signal of the flip-flop FF51 and outputs a low level signal in synchronization with the internal clock CK6B.

The flip-flop FF54 receives the output signal of the flip-flop FF52 and outputs the high level first input data mask control signal DINM1 in synchronization with the internal clock CK7. The flip-flop FF54 operates based on the write command WCOM.

The flip-flop FF55 receives the output signal of the flip-flop FF53 and outputs the low level second input data mask control signal DINM2 in synchronization with the internal clock CK7. The flip-flop FF55 operates based on the write command WCOM.

The operation, which is the same as in the first embodiment, is performed in the data control circuit 9, whereby first data of two consecutive data is masked from the time when the input-output data mask control signal DQM is fetched with the internal clock CK0. This is illustrated as data D5 in FIG. 9.

In cases where the input-output data mask control signal DQM is at low level at the leading edge of the external clock CLOCK and at high level at the trailing edge thereof (see FIG. 9, waveform c):

The flip-flop FF51 of the data mask control circuit 57 outputs a low level signal in synchronization with the leading edge of the internal clock CK0 and outputs a high level signal at the trailing edge thereof.

The flip-flop FF52 receives the output signal of the flip-flop FF51 and outputs a low level signal in synchronization with the internal clock CK6. The flip-flop FF53 receives the output signal of the flip-flop FF51 and outputs a high level signal in synchronization with the internal clock CK6B.

The flip-flop FF54 receives the output signal of the flip-flop FF52 and outputs the low level first input data mask control signal DINM1 in synchronization with the internal clock CK7. The flip-flop FF54 operates based on the write command WCOM.

The flip-flop FF55 receives the output signal of the flip-flop FF53 and outputs the high level second input data mask control signal DINM2 in synchronization with the internal clock CK7. The flip-flop FF55 operates based on the write command WCOM.

The operation, which is the same as in the first embodiment, is performed in the data control circuit 9, whereby second data of two consecutive data is masked from the time when the input-output data mask control signal DQM is fetched with the internal clock CK0. This is illustrated as data D6 in FIG. 9.

In cases where the input-output data mask control signal DQM is at low level at the leading edge and trailing edge of the external clock CLOCK.

The first input data mask control signal DINM1 and second input data mask control signal DINM2 from the data mask control circuit 7 are always at low level. Accordingly, the input data is not masked.

The invention is applicable even if the input-output frequency is four times or more as large as the frequency of the external clock. If the frequency of the input-output data mask control signal is matched with the input-output frequency of data, one of a plurality of consecutive data can be masked.

Although the burst length is "8" according to the first and second embodiments of the invention, the number of consecutive data may have any other value.

Although data, which is behind two clocks upon reception of the input-output data mask control signal, is masked when data is read according to the first and second embodiments, the data maybe changed arbitrarily.

Although data is masked upon reception of the input-output data mask control signal when data is written according to the first and second embodiments, the data may be changed arbitrarily.

Although the number of data to be masked is one or two according to the first and second embodiments, arbitrary number of data can be masked by changing the application of the input-output data control signal or by adding counter means, or the like.

Even if the frequency of write/read data is higher than a clock frequency, it is possible to mask data one by one as described above.

What is claimed is:

1. A semiconductor memory comprising:
   a memory part for storing therein a plurality of data;
   a data control circuit to which input data mask control signals and an output data mask control signal are inputted for masking arbitrary data of a plurality of consecutive data which are written on the memory part in response to the input data mask control signals and for masking arbitrary data of a plurality of consecutive data which are read from the memory part in response to the output data mask control signal; and
   a data mask control circuit for generating the input data mask control signals and the output data mask control signal in response to input-output data mask control signals.

2. The semiconductor memory according to claim 1, wherein said input-output data mask control signals comprise a plurality of input-output data mask control signals.

3. The semiconductor memory according to claim 1, wherein the input-output data mask control signals having the same frequency as an input-output frequency are inputted to the data mask control circuit.

4. The semiconductor memory according to claim 2, wherein the data mask control circuit comprises:
   a parallel-serial conversion circuit for converting the plurality of input-output data mask control signals into a signal having frequency which is the same as an output frequency;
   a first latch circuit for receiving the signal outputted from the parallel-serial conversion circuit, and outputting the output data mask control signal; and a second latch circuit for receiving a plurality of input-output data mask control signals and outputting the input data mask control signals.

5. The semiconductor memory according to claim 4, wherein the parallel-signal conversion circuit is formed of clocked inverters.

6. The semiconductor memory according to claim 1, further comprising:

a read control circuit to which the output data mask control signal is inputted for masking arbitrary data of a plurality of consecutive data which are read from the memory part in response to the output data mask control signal; and a write control circuit to which the input data mask control signals are inputted for masking arbitrary data of a plurality of consecutive data which are written on the memory part in response to the input data mask control signals.

7. The semiconductor memory according to claim 6, wherein the read control circuit comprises:

a parallel-serial conversion circuit for converting data read from the memory part into a serial signal having a given frequency; and an output data mask decision circuit to which the serial signal from the parallel-serial conversion circuit and the output data mask control signal are inputted for masking the serial signal in response to the output data mask control signal.

8. The semiconductor memory according to claim 7, wherein the parallel-serial conversion circuit is formed of clocked inverters.

9. The semiconductor memory according to claim 6, wherein the write control circuit comprises:

a serial-parallel conversion circuit for converting write data from the input-output pad into a parallel signal; and an input data mask decision circuit to which the parallel signal from the serial-parallel conversion circuit and the input data mask control signals are inputted for masking the parallel signal in response to the input data mask control signals.

10. The semiconductor memory according to claim 9, wherein the serial-parallel conversion circuit comprises a plurality of latch circuits.

11. The semiconductor memory according to claim 2, wherein the data control circuit comprises:

a read control circuit to which the output data mask control signal is inputted for masking arbitrary data of a plurality of consecutive data read from the memory part in response to the output data mask control signal; and a write control circuit to which the input data mask control signals are inputted for masking arbitrary data of a plurality of consecutive data written on the memory part in response to the input data mask control signals.

12. The semiconductor memory according to claim 11, wherein the read control circuit comprises:

a parallel-serial conversion circuit for converting data read from the memory part into a serial signal having a given frequency; and an output data mask decision circuit to which the serial signal from the parallel-serial conversion circuit and the output data mask control signal are inputted for masking the serial signal in response to the output data mask control signal.

13. The semiconductor memory according to claim 12, wherein the parallel-serial conversion circuit is formed of clocked inverters.

14. The semiconductor memory according to claim 11, wherein the write control circuit comprises:

a serial-parallel conversion circuit for converting write data from the input-output pad into a parallel signal; and an input data mask decision circuit to which the parallel signal from the serial-parallel conversion circuit and the input data mask control signals are inputted for masking the parallel signal in response to the input data mask control signals.

15. The semiconductor memory according to claim 14, wherein the serial-parallel conversion circuit comprises a plurality of latch circuits.

16. The semiconductor memory according to claim 3, further comprising:

a read control circuit to which the output data mask control signal is inputted for masking arbitrary data of a plurality of consecutive data which are read from the memory part in response to the output data mask control signal; and a write control circuit to which the input data mask control signals are inputted for masking arbitrary data of a plurality of consecutive data which are written on the memory part in response to the input data mask control signals.

17. The semiconductor memory according to claim 16, wherein the read control circuit comprises:

a parallel-serial conversion circuit for converting data read from the memory part into a serial signal having a given frequency, and an output data mask decision circuit to which the serial signal from the parallel-serial conversion circuit and the output data mask control signal are inputted for masking the serial signal in response to the output data mask control signal.

18. The semiconductor memory according to claim 17, wherein the parallel-serial conversion circuit is formed of clocked inverters.

19. The semiconductor memory according to claim 16, wherein the write control circuit comprises:

a serial-parallel conversion circuit for converting write data from the input-output pad into a parallel signal; and an input data mask decision circuit to which the parallel signal from the serial-parallel conversion circuit and the input data mask control signals are inputted for masking the parallel signal in response to the input data mask control signals.

20. The semiconductor memory according to claim 19, wherein the serial-parallel conversion circuit comprises a plurality of latch circuits.

21. The semiconductor memory according to claim 4, wherein the data control circuit comprises:

a read control circuit to which the output data mask control signal is inputted for masking arbitrary data of a plurality of consecutive data read from the memory part in response to the output data mask control signal; and a write control circuit to which the input data mask control signals are inputted for masking arbitrary data of a plurality of consecutive data written on the memory part in response to the input data mask control signals.

22. The semiconductor memory according to claim 21, wherein the read control circuit comprises:

a parallel-serial conversion circuit for converting data read from the memory part into a serial signal having a given frequency, and an output data mask decision circuit to which the serial signal from the parallel-serial conversion circuit and the output data mask control signal are inputted for masking the serial signal in response to the output data mask control signal.

23. The semiconductor memory according to claim 22, wherein the parallel-serial conversion circuit is formed of clocked inverters.

24. The semiconductor memory according to claim 21, wherein the write control circuit comprises:

a serial-parallel conversion circuit for converting write data from the input-output pad into a parallel signal; and an input data mask decision circuit to which the parallel signal from the serial-parallel conversion circuit and the input data mask control signals are inputted for masking the parallel signal in response to the input data mask control signals.

25. The semiconductor memory according to claim 24, wherein the serial-parallel conversion circuit comprises a plurality of latch circuits.

* * * * *